US 6,889,515 B2

(12) United States Patent
Tilton et al.

(10) Patent No.: US 6,889,515 B2
(45) Date of Patent: May 10, 2005

(54) SPRAY COOLING SYSTEM (75) Inventors: Charles L. Tilton, Colton, WA (US);
Donald E. Tilton, Colton, WA (US);
Ryan J. Baddeley, Liberty Lake, WA
(US); Tahir Cader, Pullman, WA (US);
George J. Wos, Colton, WA (US)

(73) Assignee: Isothermal Systems Research, Inc.,
Clarkston, WA (US)

( * ) Notice: Subject to any disclaimer, the term of this
patent is extended or adjusted under 35
U.S.C. 154(b) by 0 days.

(21) Appl. No.: 10/368,289

(22) Filed: Feb. 14, 2003

(65) Prior Publication Data

US 2004/0089008 A1 May 13, 2004

Related U.S. Application Data (63) Continuation-in-part of application No. 10/292,073, filed on Nov. 12, 2002.

(51) Int. Cl.[7] .............................................. F25D 23/12
(52) U.S. Cl. ......................... 62/259.2; 62/121; 62/304;
165/104.33; 361/699; 361/689
(58) Field of Search ........................... 62/118, 119, 132,
62/171, 64, 259.2; 165/104.33, 908; 236/75;
239/132.5; 257/715; 361/699, 689, 698,
719, 721

(56) References Cited

U.S. PATENT DOCUMENTS

| 3,887,759 | A | | 6/1975 | Staub et al. ................... 174/15 |
|---|---|---|---|---|
| 4,120,289 | A | * | 10/1978 | Bottum ........................ 126/586 |
| 4,321,797 | A | * | 3/1982 | Yaeger et al. ................... 62/79 |
| 4,352,392 | A | | 10/1982 | Eastman ................ 165/104.25 |
| 4,643,250 | A | | 2/1987 | Niggemann et al. ......... 165/159 |
| 4,897,762 | A | | 1/1990 | Daikoku et al. ............. 361/382 |
| 5,220,804 | A | | 6/1993 | Tilton et al. .................... 62/64 |
| 5,293,754 | A | | 3/1994 | Mizuno ......................... 62/185 |
| 5,515,910 | A | * | 5/1996 | Hamilton et al. ............ 165/263 |
| 5,535,595 | A | | 7/1996 | Manz .............................. 62/85 |
| 5,719,444 | A | | 2/1998 | Tilton et al. .................. 257/714 |
| 5,731,542 | A | | 3/1998 | Limper-Brenner et al. 174/52.4 |
| 5,859,763 | A | | 1/1999 | Nam et al. ................... 361/699 |
| 5,860,602 | A | | 1/1999 | Tilton et al. ................. 239/548 |
| 5,907,473 | A | | 5/1999 | Przilas et al. ................ 361/699 |
| 5,924,482 | A | | 7/1999 | Edwards et al. ........ 165/104.33 |
| 5,933,700 | A | | 8/1999 | Tilton ............................. 419/6 |
| 5,999,404 | A | | 12/1999 | Hileman ...................... 361/699 |
| 6,016,969 | A | | 1/2000 | Tilton et al. .................... 239/1 |
| 6,104,610 | A | | 8/2000 | Tilton et al. ................. 361/699 |
| 6,108,201 | A | | 8/2000 | Tilton et al. ................. 361/689 |
| 6,176,098 | B1 | | 1/2001 | Moriguchi .................. 62/259.2 |
| 6,293,760 | B1 | | 9/2001 | Pais et al. ....................... 417/53 |
| 6,317,326 | B1 | | 11/2001 | Vogel et al. ................. 361/704 |
| 6,333,849 | B1 | | 12/2001 | Donahoe et al. ............ 361/687 |
| 6,345,515 | B1 | | 2/2002 | Pautsch et al. ................ 62/311 |
| 6,349,554 | B2 | | 2/2002 | Patel et al. ................. 62/259.2 |
| 6,377,453 | B1 | | 4/2002 | Belady ........................ 361/687 |
| 6,377,458 | B1 | | 4/2002 | Morris et al. ................ 361/699 |
| 6,418,017 | B1 | | 7/2002 | Patel et al. ................... 361/700 |
| 6,421,240 | B1 | | 7/2002 | Patel ........................... 361/699 |
| 6,447,270 | B1 | | 9/2002 | Schmidt et al. .............. 417/366 |
| 6,498,725 | B2 | | 12/2002 | Cole et al. ................... 361/700 |

(Continued)

FOREIGN PATENT DOCUMENTS

EP 048 07 10 4/1992

Primary Examiner—Chen Wen Jiang
(74) Attorney, Agent, or Firm—Michael S. Neustel (57) ABSTRACT A spray cooling system for efficiently thermally managing a single or multiple semiconductor chip package. The spray cooling system includes a heat exchanger unit having a pump unit and a reservoir, a coaxial tube fluidly connected to the heat exchanger unit, a coupler unit attached to the coaxial tube, and a spray module where the coupler unit is removably connected to the spray module. The heat exchanger unit has an air tolerant design that allows for the entry and release of air without interfering with the operation thereof.

35 Claims, 9 Drawing Sheets

U.S. PATENT DOCUMENTS

| | | |
|---|---|---|
| 6,571,569 B1 | 6/2003 | Rini et al. ................. 62/259.2 |
| 2001/0050164 A1 | 12/2001 | Wagner et al. ......... 165/104.33 |
| 2002/0050144 A1 | 5/2002 | Patel et al. ................. 62/259.2 |
| 2002/0075650 A1 | 6/2002 | Morris et al. ............... 361/699 |
| 2002/0112491 A1 | 8/2002 | Malone et al. ................ 62/171 |
| 2002/0112496 A1 | 8/2002 | Bash et al. ................. 62/259.2 |
| 2002/0112497 A1 | 8/2002 | Patel et al. ................. 62/259.2 |
| 2002/0112498 A1 | 8/2002 | Bash et al. ................. 62/259.2 |
| 2002/0113141 A1 | 8/2002 | Malone et al. .............. 239/124 |
| 2002/0113142 A1 | 8/2002 | Patel et al. ................. 239/128 |
| 2002/0114139 A1 | 8/2002 | Bash et al. ................. 361/719 |
| 2002/0114140 A1 | 8/2002 | Bash et al. ................. 361/719 |

\* cited by examiner

SPRAY COOLING SYSTEM

CROSS REFERENCE TO RELATED APPLICATIONS

I hereby claim benefit under Title 35, United States Code, Section 120 of U.S. patent application Ser. No. 10/292,073 filed Nov. 12, 2002 entitled "Integrated Circuit Heat Dissipation System". This application is a continuation-in-part of the Ser. No. 10/292,073 application filed Nov. 12, 2002. The Ser. No. 10/292,073 application is currently pending. The Ser. No. 10/292,073 application is hereby incorporated by reference into this application.

STATEMENT REGARDING FEDERALLY SPONSORED RESEARCH OR DEVELOPMENT

Not applicable to this application.

BACKGROUND OF THE INVENTION

1. Field of the Invention

The present invention relates generally to spray cooling devices and more specifically it relates to a spray cooling system for efficiently thermally managing a single or multiple semiconductor chip package.

2. Description of the Related Art

Conventional spray cooling systems have been in use for years in various applications such as but not limited to semiconductor burn-in, computing, networking and power electronics where harsh environments limit the reliability of electronic components. In a typical spray cooling arrangement, multiple circuit boards are housed within a sealed enclosure isolated from the environment. The entire circuit boards are sprayed with an atomized spray of dielectric coolant thereby forming a thin liquid film on the circuit board surface which evaporates in high heat flux areas.

Examples of patented spray cooling systems include U.S. Pat. No. 6,108,201 to Tilton et al.; U.S. Pat. No. 6,104,610 to Tilton et al.; U.S. Pat. No. 6,016,969 to Tilton et al.; U.S. Pat. No. 5,933,700 to Tilton; U.S. Pat. No. 5,880,931 to Tilton et al.; U.S. Pat. No. 5,933,700 to Tilton; U.S. Pat. No. 5,860,602 to Tilton et al.; U.S. Pat. No. 5,713,327 to Tilton et al.; U.S. Pat. No. 5,314,529 to Tilton et al.; and U.S. Pat. No. 5,220,804 to Tilton et al.

However, in benign environments, such as within an office, it is often times unnecessary to isolate and thermally manage the entire circuit boards. There may be only one semiconductor chip, such as the microprocessor, or a small number of semiconductor chips on each circuit board that require active thermal management. Recent thermal management solutions incorporate hybrid air-cooling techniques (natural convection, heat sink, forced air) with advanced cooling techniques (e.g. heat pipes, thermosyphons, thermoelectric coolers, and cold plates).

The main problem with conventional combination air-cooling and advanced cooling techniques is that they sometimes cannot satisfy the high thermal management requirements of today's advanced electronics with increased power densities. A high efficiency thermal management system, such as spray cooling, is required to handle the high thermal requirements of modern electronics.

The main problem with conventional spray cooling systems is that they are designed for large-scale electronic systems. A further problem with conventional spray cooling systems is that they are not cost effective for electronics utilized within benign environments or with reduced thermal management requirements. Hence, a cost effective spray cooling system is required for effectively thermally managing smaller electronics applications.

While these devices may be suitable for the particular purpose to which they address, they are not as suitable for efficiently thermally managing a single or multiple semiconductor chip package. Conventional thermal management systems either cannot satisfy the thermal management requirements of smaller modern electronics applications or are not cost effective to implement.

In these respects, the spray cooling system according to the present invention substantially departs from the conventional concepts and designs of the prior art, and in so doing provides an apparatus primarily developed for the purpose of efficiently thermally managing a single or multiple semiconductor chip package whether under normal operation or testing.

BRIEF SUMMARY OF THE INVENTION

In view of the foregoing disadvantages inherent in the known types of thermal management systems now present in the prior art, the present invention provides a new spray cooling system construction wherein the same can be utilized for efficiently thermally managing a single or multiple semiconductor chip package, or for thermally managing multiple separate single or multiple chip semiconductor chip packages.

The general purpose of the present invention, which will be described subsequently in greater detail, is to provide a new spray cooling system that has many of the advantages of the thermal management systems mentioned heretofore and many novel features that result in a new spray cooling system which is not anticipated, rendered obvious, suggested, or even implied by any of the prior art thermal management systems, either alone or in any combination thereof.

To attain this, the present invention generally comprises a heat exchanger unit having a pump unit and a reservoir, a coaxial tube fluidly connected to the heat exchanger unit, a coupler unit attached to the coaxial tube, and a spray module where the coupler unit is removably connected to the spray module. The heat exchanger unit has an air tolerant design that allows for the entry and release of air without interfering with the operation thereof.

There has thus been outlined, rather broadly, the more important features of the invention in order that the detailed description thereof may be better understood, and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

A primary object of the present invention is to provide a spray cooling system that will overcome the shortcomings of the prior art devices.

A second object is to provide a spray cooling system for efficiently thermally managing a single or multiple semiconductor chip package.

Another object is to provide a spray cooling system for thermally managing multiple separate single or multiple chip semiconductor chip packages.

Another object is to provide a spray cooling system that is cost effective to implement within smaller electronics applications.

An additional object is to provide a spray cooling system that may be utilized within various electronics applications for thermal management such as but not limited to single chip testing systems, semiconductors such as microprocessors (e.g. workstations, servers, personal computers and laptops), power amplifiers, power semiconductor switches, and laser diodes.

A further object is to provide a spray cooling system that combines the advantage of highly efficient spray cooling with cost effective single or multiple chip thermal management.

Another object is to provide a spray cooling system that provides increased thermal management flexibility.

A further object is to provide a spray cooling system that offers higher semiconductor performance through increased power densities.

Another object is to provide a spray cooling system that has an air tolerant heat exchanger and reservoir system.

A further object is to provide a spray cooling system that utilizes a gravity drained condenser/heat-exchanger that is capable of operating within various orientations thereby allowing attachment to various computer chassis configurations.

A further object is to provide a spray cooling system that allows the heat exchanger unit to be pre-charged with coolant and connected to dry spray cooling units during final assembly.

An additional object is to provide a spray cooling system that provides a simple and low cost self-sealing detachable connector for coaxial tubing.

Another object is to provide a spray cooling system that reduces air/gas buildup within the heat exchanger thereby preventing excessive increased system pressure, preventing increased coolant temperature, and maximizing heat exchanger performance.

Another object is to provide a spray cooling system where the heat exchanger is not physically required to be in contact with the semiconductor allowing the heat to be dissipated in a more desirable location.

A further object is to provide a spray cooling system that minimizes liquid coolant inventory to avoid over pressurization.

Another object is to provide a spray cooling system that ensures that the two-phase coolant flow through the coaxial tubing is not disrupted thereby preventing spray module flooding and burnout.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

A. Overview

Turning now descriptively to the drawings, in which similar reference characters denote similar elements throughout the several views, FIGS. 1 through 9 illustrate a spray cooling system 10, which comprises a heat exchanger unit 20 having a pump unit 40 and a reservoir 25, a coaxial tube 60 fluidly connected to the heat exchanger unit 20, a coupler unit 70 attached to the coaxial tube 60, and a spray module 50 where the coupler unit 70 is removably connected to the spray module 50. The heat exchanger unit 20 has an air tolerant design that allows for the entry and release of air without interfering with the operation thereof.

B. Heat Exchanger Unit

Figure 3:
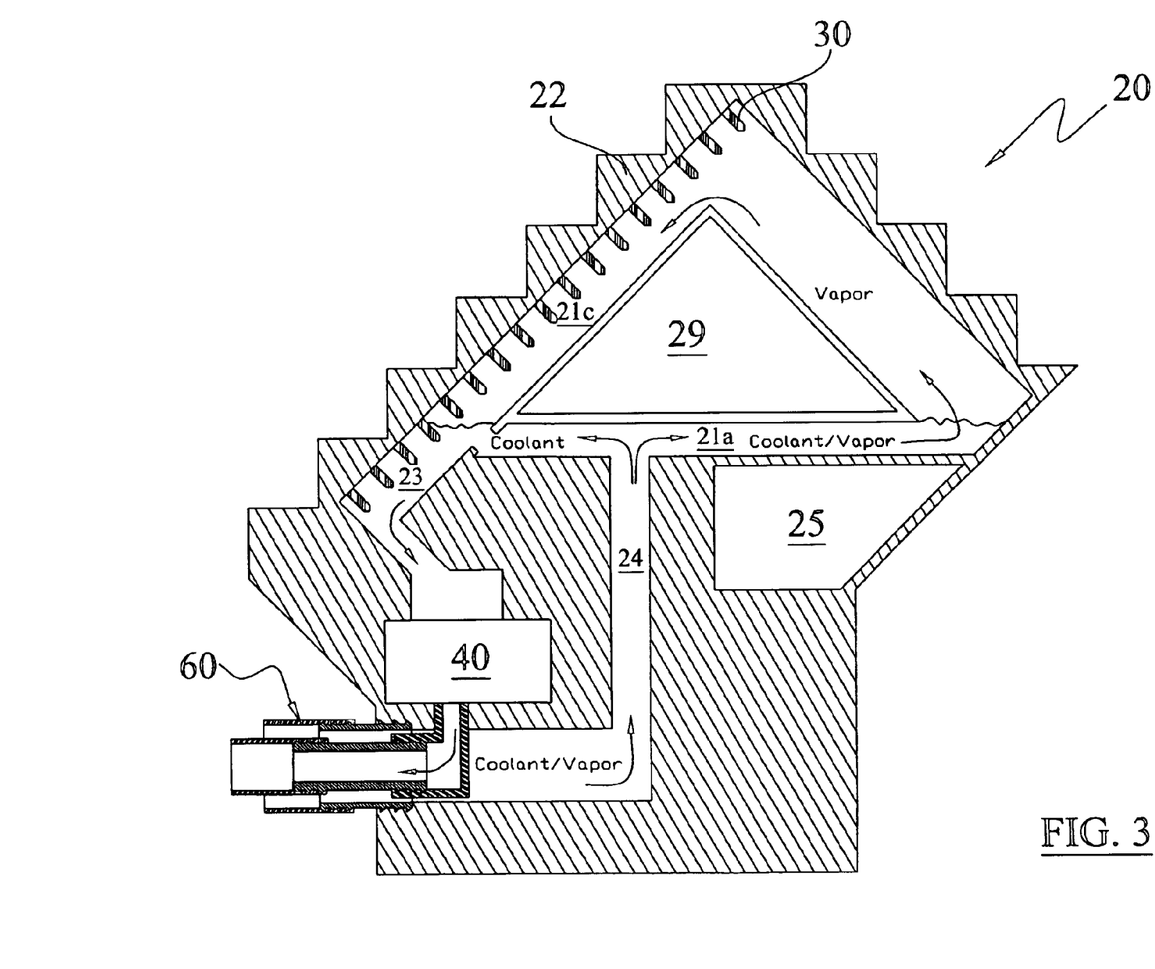
FIG. 3 is a side cutaway view of the heat exchanger unit illustrating the coolant and gas flow.

The heat exchanger unit 20 is a self-contained structure including a pump unit 40, a reservoir 25 and an air chamber 29 as best illustrated in FIG. 3 of the drawings. The heat exchanger unit 20 is designed to be gravity operated in various orientations and to tolerant to the entry of air and other gases into the fluid system without impacting the operation thereof.

Figure 1:
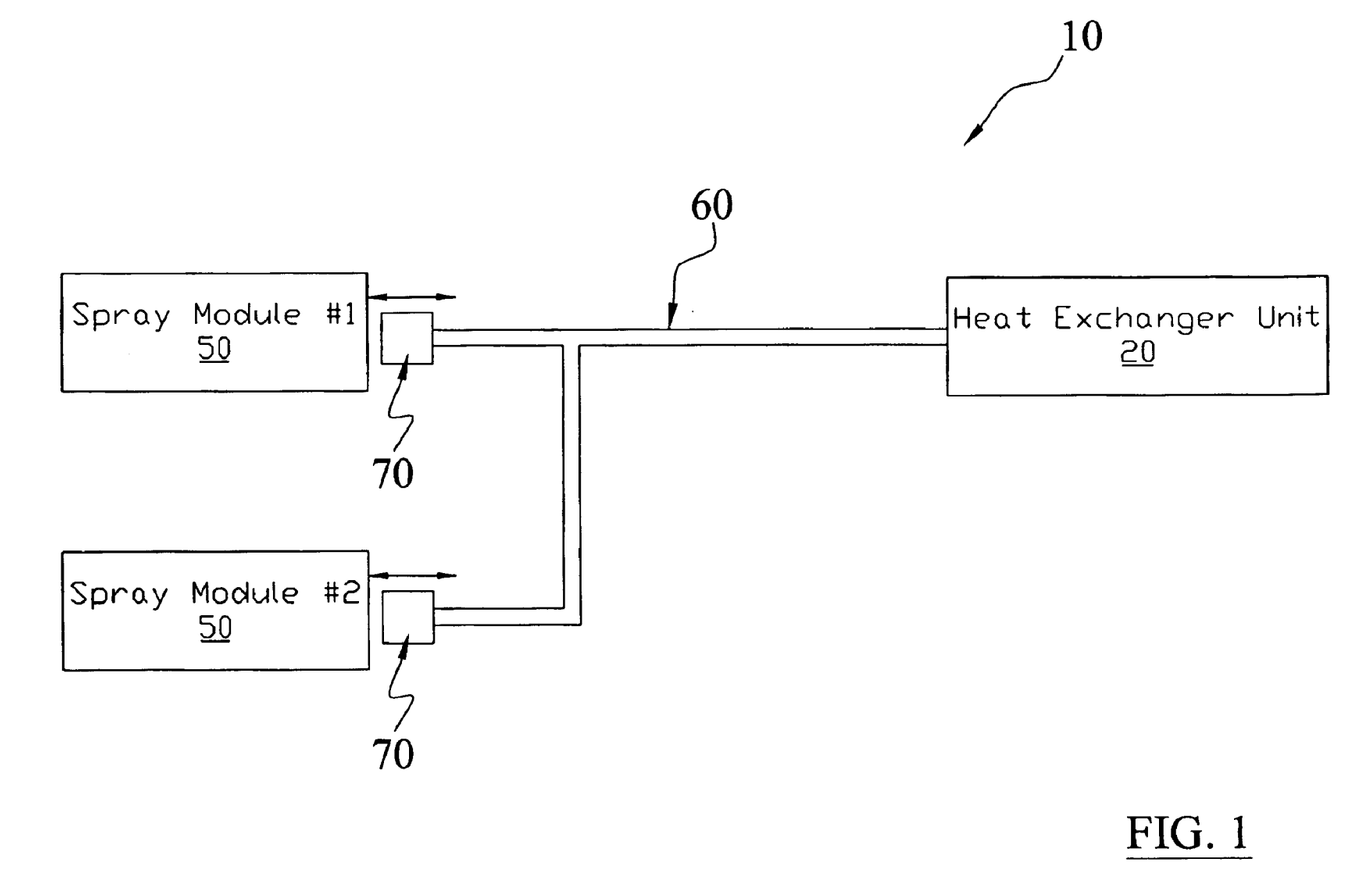
FIG. 1 is a block diagram of the present invention illustrating the removable connection of the heat exchanger unit with one or more spray modules.
Figure 2:
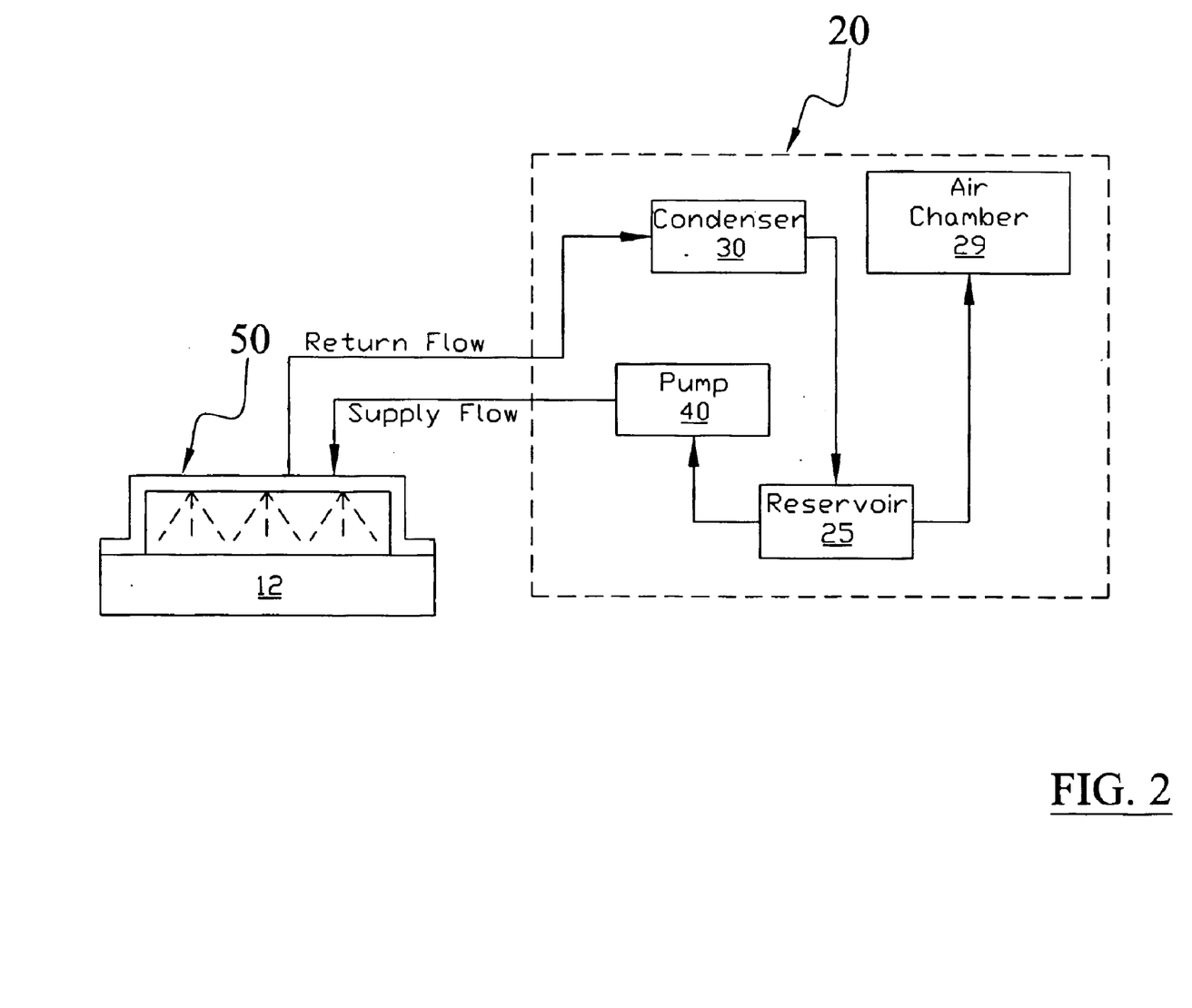
FIG. 2 is a schematic diagram of the present invention illustrating the structure of the heat exchanger unit.

The heat exchanger unit 20 is fluidly connected to one or more spray modules 50 as illustrated in FIG. 1 of the drawings. The heat exchanger unit 20 provides pressurized dielectric coolant supply flow to the spray module 50 for thermally conditioning a semiconductor 12 (or electronics module) and receives a return flow of the coolant from the spray module 50.

The heat exchanger separates the gases from the liquid coolant into the air chamber 29 to avoid interference with the fluid flow within the heat exchanger unit 20. The air becomes trapped within the air chamber 29 thereby eliminating air flooding into the fluid passage 23 and improving performance. The heat exchanger unit 20 condenses the coolant gases and thermally conditions the coolant prior to return to the spray module 50.

Figure 5:
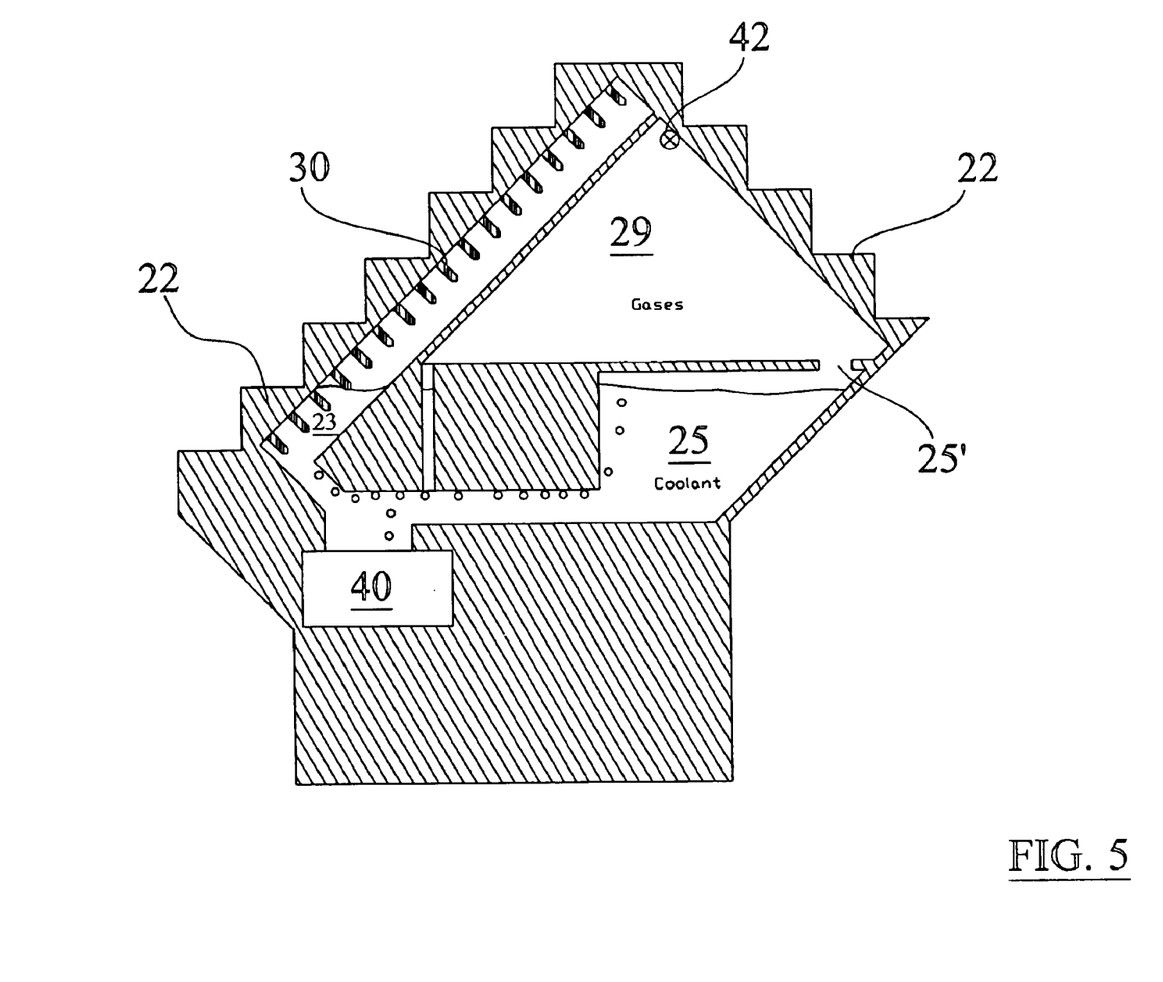
FIG. 5 is a side cutaway view of the heat exchanger unit illustrating the air chamber.
Figure 6:
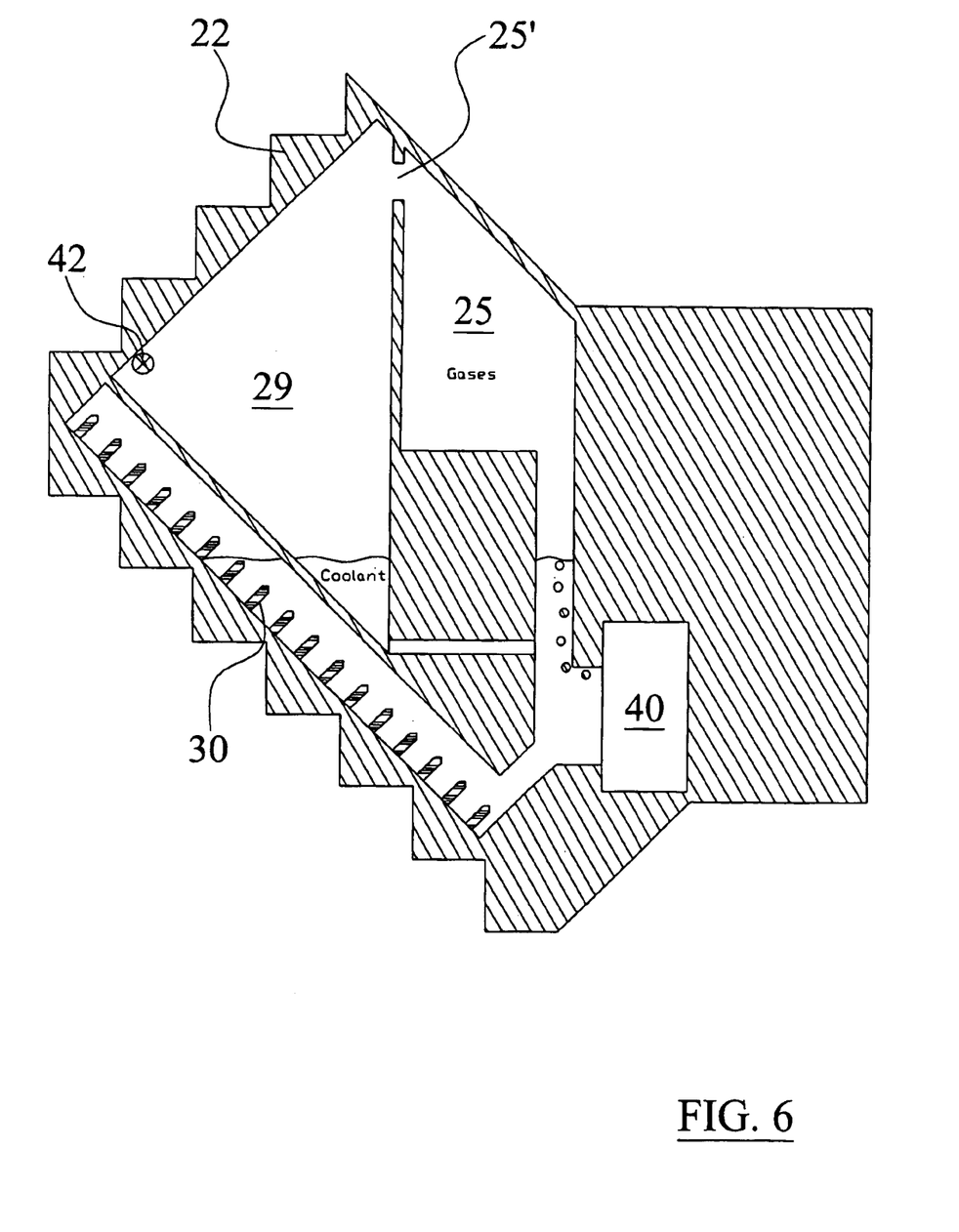
FIG. 6 is a side cutaway view of the heat exchanger unit rotated counter-clockwise 90 degrees illustrating the continued fluid and gas flow.

The heat exchanger unit 20 has a pump unit 40 as shown in FIGS. 3, 5 and 6 of the drawings. The pump unit 40 is fluidly connected to the reservoir 25 as shown in FIG. 5 of the drawings. The pump unit 40 delivers an accurate amount of pressurized dielectric coolant supply flow to a distribution manifold where the coolant is directed through a tube to the spray module 50.

The pump unit 40 is preferably connected to both the reservoir 25 and the fluid passage 23 together for moderating the fluid flow into the pump unit 40 thereby reducing pump cavitation as shown in FIG. 5 of the drawings. This fluid connection reduces the fluid pressure variations when the spray module 50 may be generating significant volumes of coolant vapor (e.g. when the semiconductor 12 is operating at a high level) or when the coolant vapor is substantially reduced (e.g. when the semiconductor 12 enters a power saving mode).

An exemplary spray module 50 is illustrated in U.S. Pat. No. 5,220,804 to Tilton that is hereby incorporated by reference. The tube is preferably comprised of a coaxial tube 60 for allowing the supply flow and the return flow to pass within a single tube structure, however various other non-coaxial structures may be utilized within the present invention. An exemplary pump unit 40 is illustrated in U.S. Pat. No. 6,447,270 that is hereby incorporated by reference.

The coolant return flow is preferably filtered prior to entry into the reservoir 25. However, the coolant may be filtered within or after the reservoir 25 as can be appreciated by one skilled in the art of the present invention. The filtration process preferably removes chemicals, particulate material and other undesirable material from the coolant.

The reservoir 25 is capable of retaining a sufficient volume of coolant in order to operate one or more spray modules 50. The reservoir 25 may be positioned in various locations within the heat exchanger unit 20, however the reservoir 25 is preferably positioned within a lower portion of the heat exchanger unit 20 for allowing the reservoir 25 to be filled via gravity from the condensing passage 21c. It can be appreciated that an additional pump may be utilized to fill the reservoir 25 from the coolant return flow.

The reservoir 25 is further designed to accommodate various dynamic coolant conditions with reduced sensitivity to the presence of air and other gases. The reservoir 25 is fluidly connected to an air chamber 29 via an air passage 25'. The air passage 25' is within an upper portion of the reservoir 25 for allowing air and other gases within the reservoir 25 to pass upwardly within the coolant through the air passage 25' into the air chamber 29 as shown in FIGS. 5 and 6 of the drawings. The air chamber 29 is preferably also connected to the passage connecting the reservoir 25 and the pump unit 40 by a small passageway to allow condensed coolant within the air chamber 29 to return to the reservoir 25 as illustrated in FIGS. 5 and 6 of the drawings. The air chamber 29 prevents the air and other gases from entering the coolant supply flow during operation of the present invention.

The air chamber 29 is of a sufficient volume for receiving and storing the collected air and non-condensable gases from the reservoir 25. The system may also incorporate a pressure relief valve 42 within an upper portion of the air chamber 29 is fluidly connected to the outside environment for allowing periodic releases of the collected air and non-condensable gases from within the air chamber 29 as shown in FIGS. 5 and 6 of the drawings.

As shown in FIGS. 3, 5 and 6 of the drawings, the coolant return flow from the spray module 50 is delivered through a return passage 24 by the coaxial tube 60. The return passage 24 is fluidly connected to the main passage 21a as shown in FIG. 3 of the drawings. The return passage 24 is fluidly connected to the fluid passage 23 and the vapor passage 21b.

The liquid coolant passes through the fluid passage 23 into the reservoir 25 and to the pump unit 40 as shown in FIG. 5 of the drawings.

Figure 4:
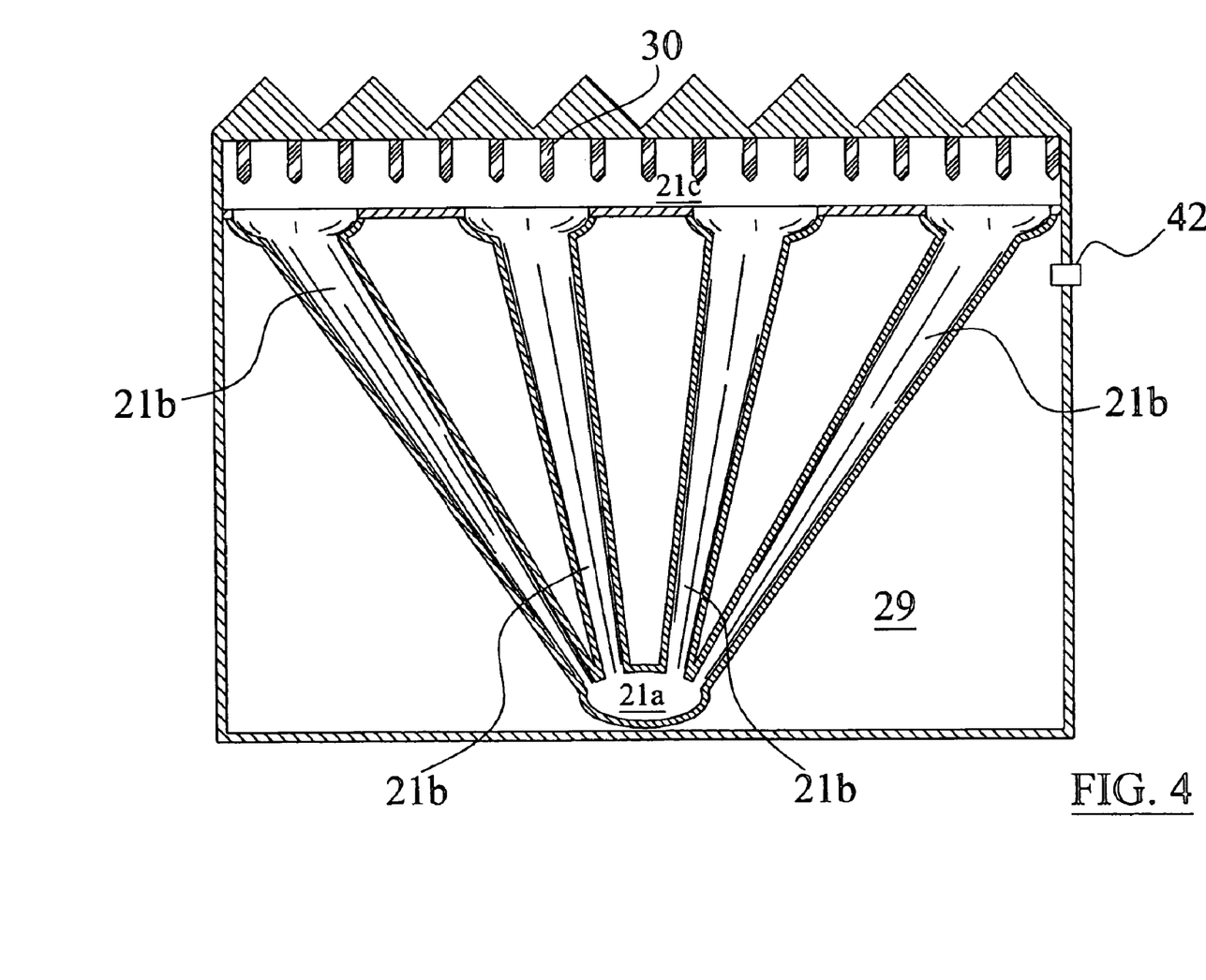
FIG. 4 is a side cutaway view of the heat exchanger unit illustrating the vapor and fluid passages.

The vapor or gases within the coolant return flow then pass through vapor passage 21b and into the condensing passage 21c where the coolant vapor is condensed to a liquid state as shown in FIG. 4 of the drawings. The condensing members 30 protrude into the vapor passage 21b thereby reducing the temperature of the coolant vapor to a point that the vapor is condensed. The exterior of the heat exchanger unit 20 adjacent the condensing members 30 preferably has a plurality of heat exchange members 22 for dissipating the collected heat from the condensing members 30 externally of the heat exchanger unit 20 as shown in FIGS. 3, 5 and 6 of the drawings. The condensing members 30 and the heat exchange members 22 may have various structures capable of conducting and transferring heat. The condensed coolant is then returned back to the fluid passage 23 as illustrated in FIGS. 4 and 5 of the drawings.

C. Spray Modules

Figure 9:
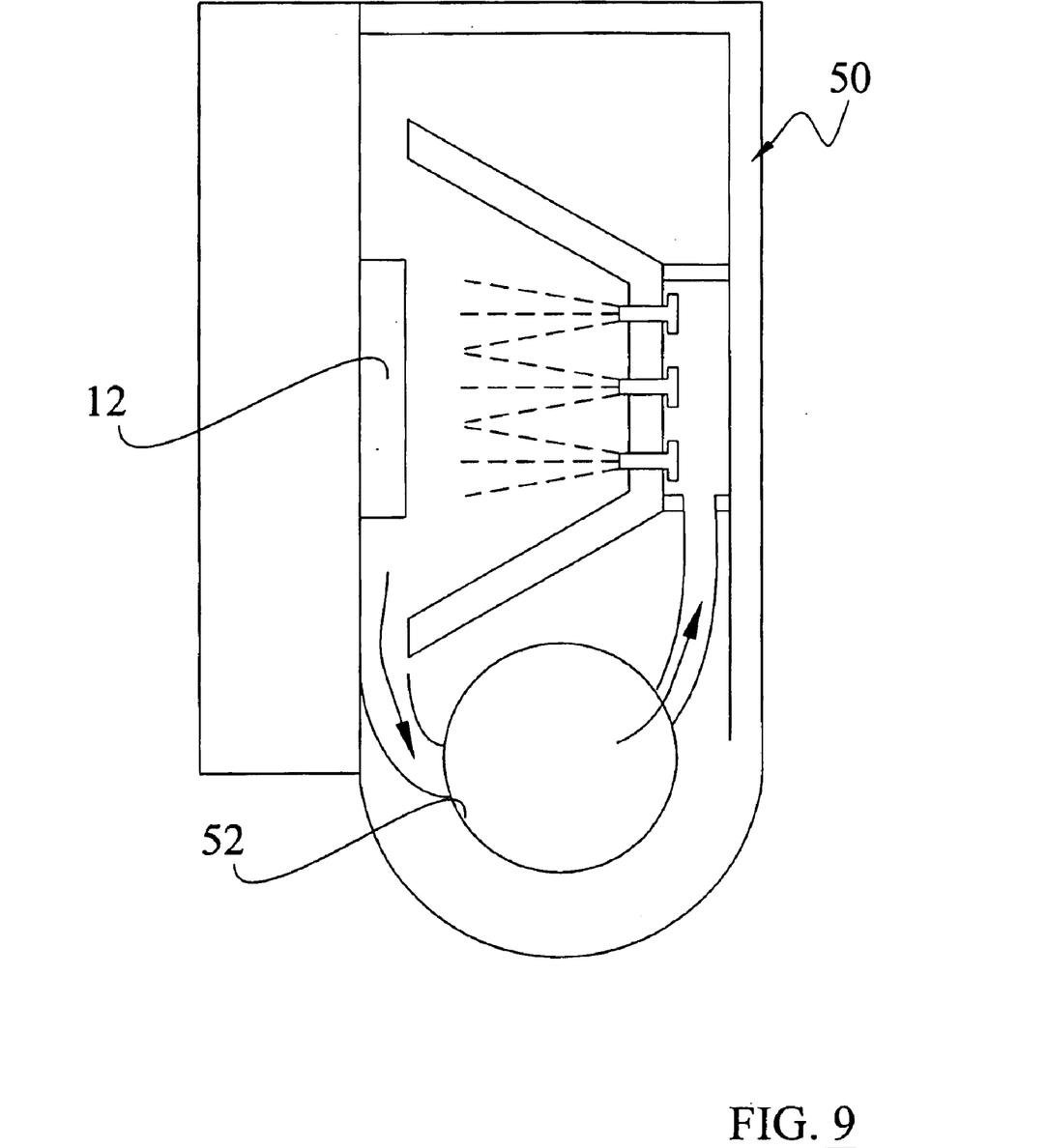
FIG. 9 is a side view of the spray module.

The spray modules 50 may be comprised of various spray structures available within the spray cooling industry. FIG. 9 illustrates an exemplary spray module 50 for spraying an atomized coolant upon the surface of the semiconductor 12. The semiconductor 12 may be comprised of a single chip or multiple chips. The semiconductor 12 may also be comprised of various types of electronic devices such as but not limited to microprocessors, power amplifiers, power semiconductor switches, laser diodes, and the like. Various other configurations may be utilized to construct the spray module 50.

The spray modules 50 are scalable and can be easily configured to a wide range of semiconductor 12 sizes, shapes and structures. The spray module 50 to semiconductor 12 interface may have various configurations such as but not limited to (1) direct bonding or removably sealed with coolant sprayed on bare die, (2) direct bonding or removably with coolant sprayed on standard die, or (3) direct bonding via a thermally conductive interface with no coolant directly impinging the die or chip package.

FIG. 9 illustrates a receiver opening 52 within the spray module 50 for removably receiving a coupler unit 70. The receiver opening 52 includes at least one inlet passage for receiving the coolant supply flow and at least one outlet passage for dispensing the coolant return flow. Various other configurations may be utilized with the present invention.

The spray module 50 has a two-phase liquid-vapor collection manifold that directs the liquid-vapor away from the heated surface in order to prevent flooding of the heated surface of the semiconductor 12. The liquid-vapor collection manifold is designed to couple the momentum induced by the pressurized droplets with the energy being added to the coolant fluid through the semiconductor 12 as described within U.S. Pat. No. 5,220,804 which is hereby incorporated herein by reference. The liquid-vapor collection manifold within the spray module 50 preferably utilizes vapor recirculation vanes that control the high velocity vapor patterns that develop when the liquid coolant evaporates and increases velocity. If the velocity of the coolant vapor is not controlled, the vapor patterns create undesirable low-pressure zones near the atomizer orifice creating relatively large pressure recirculation zones. Areas of the semiconductor 12 near the recirculation zones will not be wetted adequately with the coolant thereby leading to specific hot spots on the semiconductor 12. The spray module 50 may also incorporate additional structure and functionality for fluid control as described within U.S. Pat. Nos. 6,104,610 and 6,108,201 wherein are hereby incorporated by reference.

D. Coupler Unit

Figure 7:
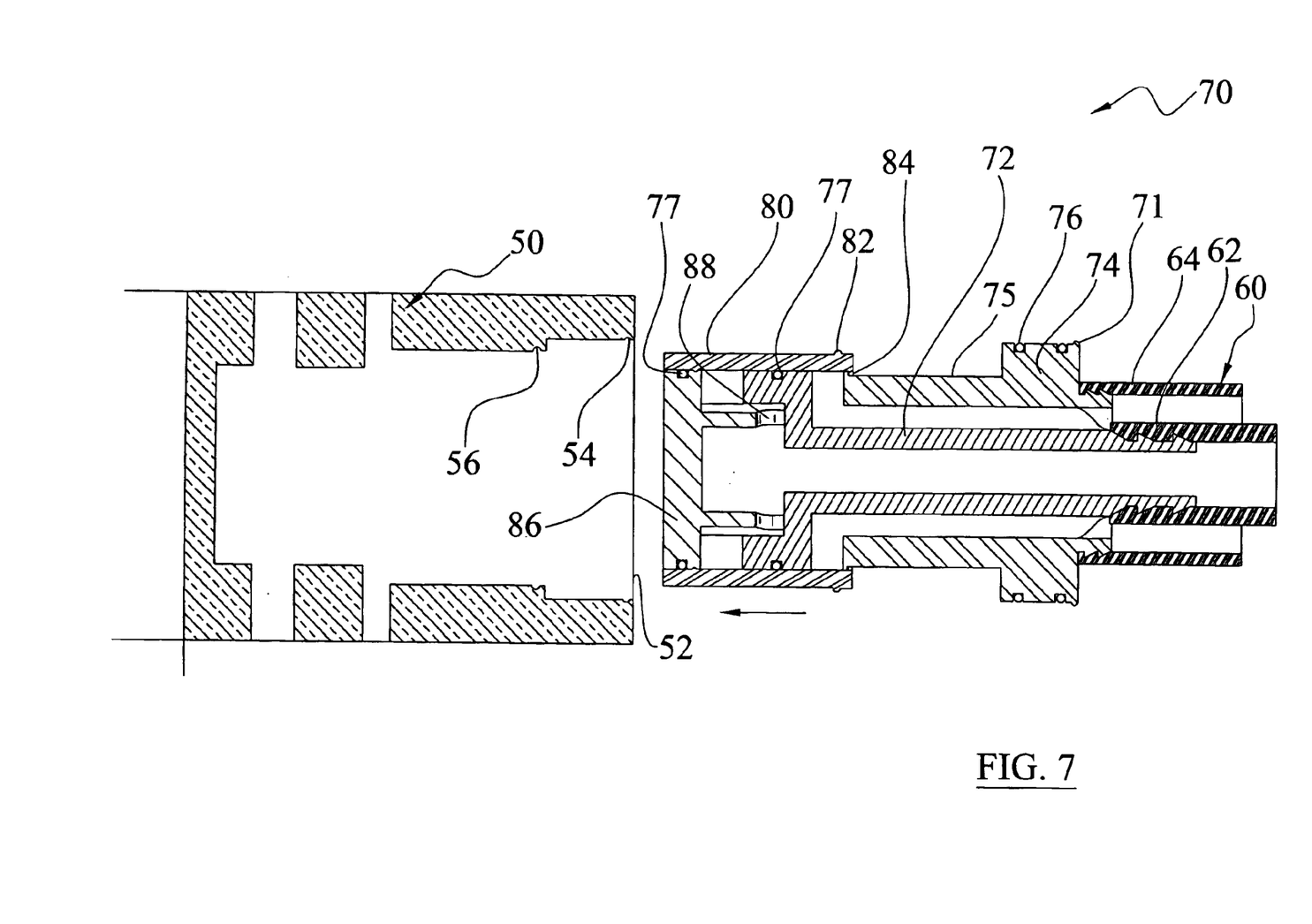
FIG. 7 is a side cutaway view of the coupler unit with respect to the receiver opening of the spray module.
Figure 8:
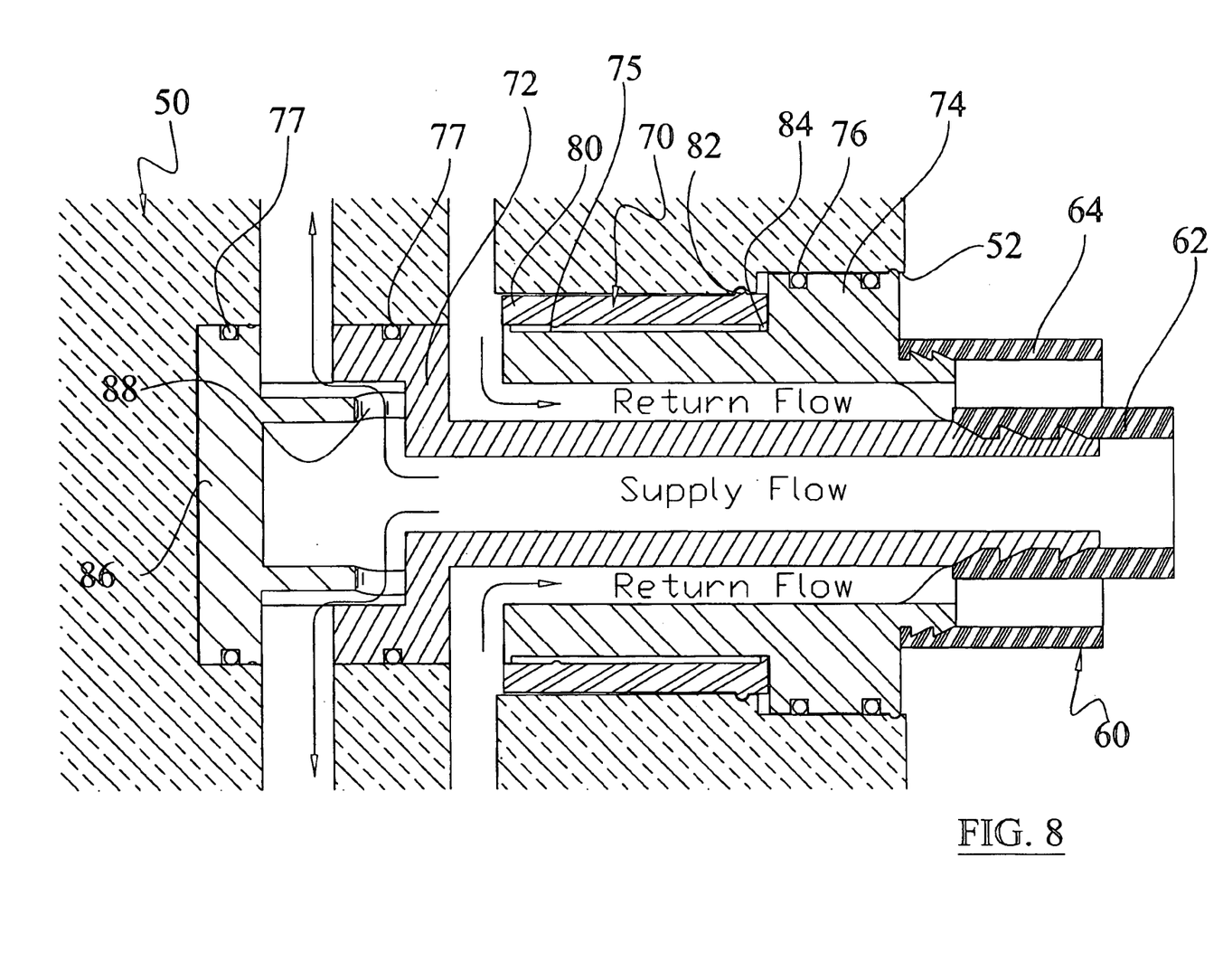
FIG. 8 is a side cutaway view of the coupler unit fully positioned within the receiver opening of the spray module with the coolant supply flow and return flow passing unobstructed.

The coupler unit 70 is comprised of a first section 72 and a second section 74 surrounding the first section 72 as shown in FIGS. 7 and 8 of the drawings. The first section 72 and the second section 74 each have a tubular structure with various possible cross sectional configurations.

The passage is formed between the first section 72 and the second section 74 that receives the coolant return flow from the outlet passage of the spray module 50 which is then transferred through the coaxial tube 60 back to the heat exchanger unit 20. The second section 74 receives the outer tube 64 of the coaxial tube 60 as shown in FIG. 7 of the drawings. The coaxial tube 60 may be comprised of various types and sizes of tubing such as but not limited to a cheaper permeable inner tube 62 surrounded by a more expensive (and rigid) impermeable outer tube 64. The first section 72 transfers the coolant supply flow into the spray module 50 to the inlet passage as shown in FIG. 8 of the drawings.

A third section 86 is attached within a distal end of the first section 72 as shown in FIGS. 7 and 8 of the drawings. The third section 86 preferably has a cross sectional shape (e.g. triangular, square, polygonal, etc.) different from the interior cross section of the first section 72 thereby allowing the coolant supply flow to pass through passages 88 within the third section 86 into the inlet passage of the spray module 50. The third section 86 has a distal flanged structure that corresponds to the shape and size of the exterior of the first section 72 as shown in FIGS. 7 and 8 of the drawings. The third section 86 preferably has a seal 77 that allows for sealing within the receiver opening 52 in FIG. 8 of the drawings and for sealing against the interior of the collar member 80 when the collar member 80 is closed to prevent leakage as shown in FIG. 7 of the drawings.

The second section 74 has one or more first seals 76 for sealing against the interior wall of the receiver opening 52 as shown in FIGS. 7 and 8 of the drawings. The first section 72 includes one or more second seals 77 for sealing against the interior wall of the receiver opening 52 thereby forming a sealed passage for the coolant return flow as shown in FIG. 8 of the drawings.

A collar member 80 is slidably positioned about the coupler unit 70 for selectively closing and opening the supply flow and return flow passages as shown in FIGS. 7 and 8 of the drawings. The second section 74 has a recessed portion 75 that slidably receives an engaging lip 84 extending from the collar member 80 as further shown in FIGS. 7 and 8 of the drawings. The engaging lip 84 ensures proper alignment of the collar member 80 about the passages within the coupler unit 70 when the collar member 80 is closed upon the coupler unit 70 as shown in FIG. 7 of the drawings. The collar member 80 may also be springably retained upon the coupler unit 70 in a closed manner by a spring or similar biasing structure. The collar member 80 preferably includes one or more detents (unnumbered) that extend inwardly for selectively engaging the third section 86 when in the closed position (FIG. 7) and engaging the second section 74 when in the open position (FIG. 8).

The coupler unit 70 includes one or more first ridges 71 protruding from the second section 74 that are removably connectable within corresponding first grooves 54 within the receiver opening 52 of the spray module 50 as shown in FIGS. 7 and 8 of the drawings. The coupler unit 70 further includes one or more second ridges 82 protruding from the collar member 80 that are removably connectable within corresponding second grooves 56 within the receiver opening 52 of the spray module 50 as shown in FIGS. 7 and 8 of the drawings.

The first grooves 54 and the first ridges 71 serve to retain the coupler unit 70 snugly within the receiver opening 52 as shown in FIG. 8 of the drawings. There are various other methods and structures that may be utilized to retain the coupler unit 70 within the receiver opening 52 such as clips, fasteners and the like. The second grooves 56 and the second ridges 82 open the collar member 80 upon the coupler unit 70 during the insertion of the coupler unit 70 into the receiver opening 52 as shown in FIG. 8 of the drawings. The second grooves 56 and the second ridges 82 close the collar member 80 upon the coupler unit 70 during the removal of the coupler unit 70 from the receiver opening 52 as shown in FIG. 7 of the drawings.

FIGS. 3, 5 and 6 of the drawings illustrate the usage of a coaxial coupler (unnumbered) to connected the coaxial tube 60 with the return passage 24 and the pump unit 40 coolant supply passage of the heat exchanger unit 20. It can be appreciated that the coupler unit 70 may be utilized within a receiver opening within the heat exchanger unit 20 in addition to or exclusive of using a coupler unit 70 within the spray module 50 for connecting to the return passage 24.

E. Control Unit

The control unit (not shown) may be comprised of various electronic devices capable of communicating with and controlling the semiconductor 12, the spray modules 50, the heat exchanger unit 20 including the pump unit 40, and valves. The control unit may be comprised of a computer or other electronic device capable of receiving and storing commands.

The control unit may communicate with the external electrical devices such as but not limited to electrically or via communications signal. The control unit may be programmed to operate the external devices at various operating levels such as but not limited to controlling the temperature of the fluid within the reservoir 25, controlling the fluid pressure and flow rate emitted by the pump unit 40, controlling the spray pattern and flow of the spray modules 50, and controlling the flow of fluid to the spray modules 50. It can be appreciated that more than one control unit may be utilized to control one or more of the components of the present invention. The control unit may be wholly contained within the pump unit 40.

F. Operation

In use, the heat exchanger unit 20 may be pre-charged with liquid coolant prior to shipping to a customer for assembly at the customer's site. It is desirable to have the heat exchanger unit 20 and the spray module 50 containing less than 30% liquid coolant of the total holding capacity with the remaining volume air and/or gases. The coupler unit 70 is inserted into the receiver opening 52 of the spray module 50 as shown in FIGS. 1, 7 and 8 of the drawings. During the insertion of the coupler unit 70 into the receiver opening 52, the collar member 80 is moved rearwardly upon the coupler unit 70 thereby exposing and fluidly connecting the return flow passage and the supply flow passage of the coupler unit 70 to the outlet passage and inlet passage of the spray module 50 respectively. The user then activates the heat exchanger unit 20 via the control unit. The pump unit 40 draws the liquid coolant from the reservoir 25 and into the inner tube 62 of the coaxial tube 60 as shown in FIG. 3 of the drawings. The coolant supply flow is transferred to the spray module 50 through the coupler unit 70 as shown in FIG. 8 of the drawings. The coolant is thereafter atomized and sprayed upon the semiconductor 12 as shown in FIG. 9 of the drawings. A portion of the coolant sprayed upon the semiconductor 12 is phase changed into vapor. The liquid coolant and vapor is then collected within the spray module 50 and returned to the return flow within the coupler unit 70 and the coaxial tube 60. The coolant return flow is then delivered into the heat exchanger via the return passage 24 as shown in FIG. 3 of the drawings. The mixture of liquid and vapor coolant is then separated within the main passage 21a. The liquid is allowed to return to the reservoir 25 via the fluid passage 23 as shown in FIG. 4 of the drawings. The vapor passes through the vapor passage 21b upwardly and then into the condensing passage 21c where the vapor is condensed into a liquid by the cooling effect of the condensing members 30 as shown in FIGS. 3 and 4 of the drawings. The condensed coolant within the condensing passage 21c is then combined with the liquid coolant within the fluid passage 23 for transfer to the reservoir 25 and/or pump unit 40 as shown in FIG. 3 of the drawings. The coolant within the reservoir 25 may be further thermally conditioned via conventional thermal conditioning means if required.

When access to the semiconductor 12 is required, the coupler unit 70 may be removed from the receiver opening 52 thereby providing access to the semiconductor 12. As the coupler unit 70 is removed from the receiver opening, the second ridge 82 of the collar member 80 causes the collar member 80 to remain stationary with respect to the spray module 50 as the remainder of the coupler unit 70 is removed. The collar member 80 is thereby allowed to slide over the passage openings of the coupler unit 70 in a sealed manner thereby preventing coolant within the heat exchanger unit 20 and the coaxial tube 60 from escaping. When the spray module 50 is in condition to be operated again, the above-stated process is repeated for fluidly connecting the heat exchanger unit 20 to the spray module 50.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed to be within the expertise of those skilled in the art, and all equivalent structural variations and relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

We claim:

1. A spray cooling system for thermally managing an electronic device, comprising:
   a spray module; and
   a heat exchanger unit fluidly connected to said spray module, said heat exchanger including:
      a reservoir for storing a volume of coolant;
      a chamber fluidly connected to said reservoir, wherein said chamber is positioned above said reservoir for receiving gases;
      a pump unit fluidly connected to said reservoir; and
      a pressure relief valve fluidly connecting said chamber to an exterior of said heat exchanger unit.

2. The spray cooling system of claim 1, wherein said pressure relief valve is positioned within an upper portion of said chamber.

3. The spray cooling system of claim 1, wherein said heat exchanger unit includes a condensing section for condensing coolant vapor.

4. The spray cooling system of claim 3, wherein said condensing section is comprised of a condensing passage fluidly connected to a fluid passage that is fluidly connected to said reservoir for allowing condensed coolant to return to said reservoir.

5. The spray cooling system of claim 4, including a plurality of condensing members within said condensing passage.

6. The spray cooling system of claim 5, including a plurality of heat exchange members protruding externally of said heat exchange unit opposite of said condensing members.

7. The spray cooling system of claim 1, including a vapor passage fluidly connected to a main passage containing returned coolant and to said condensing passage.

8. The spray cooling system of claim 1, wherein said vapor passage extends upwardly from said main passage.

9. The spray cooling system of claim 1, wherein said heat exchanger unit is fluidly connected to said spray module by a coaxial tube containing a supply flow and a return flow of coolant.

10. A heat exchanger apparatus for an electronic device thermal management system, comprising:
    a pump unit;
    a reservoir for storing a volume of coolant, wherein said reservoir is fluidly connected to said pump unit;
    a chamber fluidly connected to said reservoir, wherein said chamber is positioned above said reservoir for receiving gases; and
    a pressure relief valve fluidly connecting an upper portion of said chamber to an exterior of said heat exchanger unit.

11. The heat exchanger apparatus of claim 10, wherein less than 25% of the total interior volume of said reservoir and said chamber is comprised of liquid coolant.

12. The heat exchanger apparatus of claim 10, including a condensing section for condensing coolant vapor fluidly connected to said reservoir.

13. The heat exchanger apparatus of claim 12, wherein said condensing section is comprised of a condensing passage fluidly connected to a fluid passage that is fluidly connected to said reservoir for allowing condensed coolant to return to said reservoir.

14. The heat exchanger apparatus of claim 13, including a plurality of condensing members within said condensing passage.

15. The heat exchanger apparatus of claim 14, including a plurality of heat exchange members protruding externally of said condensing section opposite of said condensing members.

16. The heat exchanger apparatus of claim 13, including a vapor passage fluidly connected to a main passage containing returned coolant and to said condensing passage.

17. The heat exchanger apparatus of claim 16, wherein said vapor passage extends upwardly from said main passage.

18. The heat exchanger apparatus of claim 10, wherein said pump unit is fluidly connected to a spray module by a coaxial tube containing a supply flow and a return flow of coolant.

19. A method of operating a heat exchanger unit for an electronic device thermal management system, said method comprising:
    passing a return flow coolant into a main passage fluidly connected to a reservoir;

permitting gases within said reservoir to flow upwardly into a chamber through a passage within an upper portion of said reservoir;

permitting a coolant vapor to flow through a vapor passage to a condensing passage;

condensing said coolant vapor within said condensing passage;

permitting said condensed coolant to flow through a fluid passage fluidly connected to said reservoir; and permitting the collection of gases within a gas chamber.

20. The method of operating a heat exchanger unit of claim 19, including the step of purging said chamber.

21. The method of operating a heat exchanger unit of claim 19, wherein less than 25% of the total interior volume of said heat exchanger unit is comprised of liquid coolant.

22. A method of manufacturing a computer system having a semiconductor to be thermally managed, said method comprising the steps of:

securing a spray module upon said semiconductor, wherein said spray module has an initial state of dry;

fluidly connecting a heat exchanger unit to said spray module, wherein said heat exchanger unit has an initial state prior to connecting to said spray module; and allowing air to migrate into said heat exchanger unit.

23. The method of manufacturing a computer system of claim 22, wherein said initial state of said heat exchanger unit is pre-charged with at least 10% liquid coolant by available interior fluid volume.

24. A spray cooling system for thermally managing an electronic device, comprising:

a spray module; and a heat exchanger unit fluidly connected to said spray module, said heat exchanger including a reservoir for storing a volume of coolant, a chamber fluidly connected to said reservoir, wherein said chamber is positioned above said reservoir for receiving gases, and a pump unit fluidly connected to said reservoir;

wherein said heat exchanger unit includes a condensing section comprised of a condensing passage fluidly connected to a fluid passage that is fluidly connected to said reservoir for allowing condensed coolant to return to said reservoir.

25. The spray cooling system of claim 24, including a plurality of condensing members within said condensing passage.

26. The spray cooling system of claim 25, including a plurality of heat exchange members protruding externally of said heat exchange unit opposite of said condensing members.

27. The spray cooling system of claim 24, including a vapor passage fluidly connected to a main passage containing returned coolant and to said condensing passage.

28. The spray cooling system of claim 27, wherein said vapor passage extends upwardly from said main passage.

29. A spray cooling system for thermally managing an electronic device, comprising:

a spray module; and a heat exchanger unit fluidly connected to said spray module by a coaxial tube containing a supply flow and a return flow of coolant, said heat exchanger including a reservoir for storing a volume of coolant, a chamber fluidly connected to said reservoir, wherein said chamber is positioned above said reservoir for receiving gases, and a pump unit fluidly connected to said reservoir.

30. A heat exchanger apparatus for an electronic device thermal management system, comprising:

a pump unit;

a reservoir for storing a volume of coolant, wherein said reservoir is fluidly connected to said pump unit;

a chamber fluidly connected to said reservoir, wherein said chamber is positioned above said reservoir for receiving gases; and a condensing passage fluidly connected to a fluid passage that is fluidly connected to said reservoir for allowing condensed coolant to return to said reservoir.

31. The heat exchanger apparatus of claim 30, including a plurality of condensing members within said condensing passage.

32. The heat exchanger apparatus of claim 31, including a plurality of heat exchange members protruding externally of said heat exchange unit opposite of said condensing members.

33. The heat exchanger apparatus of claim 30, including a vapor passage fluidly connected to a main passage containing returned coolant and to said condensing passage.

34. The heat exchanger apparatus of claim 33, wherein said vapor passage extends upwardly from said main passage.

35. A heat exchanger apparatus for an electronic device thermal management system, comprising:

a pump unit;

a reservoir for storing a volume of coolant, wherein said reservoir is fluidly connected to said pump unit;

a chamber fluidly connected to said reservoir, wherein said chamber is positioned above said reservoir for receiving gases; and wherein said pump unit is fluidly connected to a spray module by a coaxial tube containing a supply flow and a return flow of coolant.

* * * * *